(12) United States Patent
Yamazaki

(10) Patent No.: US 6,459,129 B1
(45) Date of Patent: *Oct. 1, 2002

(54) BICMOS DEVICE HAVING A CMOS GATE ELECTRODE AND A BIPOLAR EMITTER EACH CONTAINING TWO IMPURITIES OF THE SAME CONDUCTIVITY TYPE

(75) Inventor: Toru Yamazaki, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/041,657

(22) Filed: Mar. 13, 1998

(30) Foreign Application Priority Data

Mar. 14, 1997 (JP) ............................................. 9-060753

(51) Int. Cl.$^7$ ........................... H01L 29/76; H01L 29/94
(52) U.S. Cl. ...................................... 257/370; 257/378
(58) Field of Search ............................... 257/370, 378, 257/385, 412, 555; 438/202, 205, 309, 234, 588, 592

(56) References Cited

U.S. PATENT DOCUMENTS

| 4,803,175 A | 2/1989 | Alvarez et al. ............. 438/353 |
| 5,731,617 A | * 3/1998 | Suda ........................... 257/370 |
| 5,838,048 A | * 11/1998 | Hirai et al. ................... 257/378 |
| 5,998,843 A | * 12/1999 | Yoshida ....................... 257/370 |

FOREIGN PATENT DOCUMENTS

| JP | 2-26061 | 1/1990 |
| JP | 2-241057 | 9/1990 |
| JP | 3-76154 | 4/1991 |
| JP | 3-204968 | 9/1991 |
| JP | 6-77314 | * 3/1994 |
| JP | 7-44184 | 5/1995 |

* cited by examiner

*Primary Examiner*—Steven Loke
*Assistant Examiner*—Hung Kim Vu

(57) ABSTRACT

A semiconductor device and a method of producing the same are disclosed. After boron or similar p-type impurity has been introduced into a polysilicon layer constituting a pMOS gate, annealing can be effected at an optimal temperature low enough to prevent the impurity from entering a silicon substrate via a gate oxide film, e.g., 800° C. or below in the case of boron. This prevents the characteristic of a transistor, e.g., threshold voltage from being varied. Further, in an nMOS gate electrode and source-drain region, the n-type impurity can be provided with a concentration reducing the resistance of a silicide layer. In addition, in the emitter diffusion layer of a bipolar transistor, the concentration of the n-type impurity does not fall and allows a current amplification factor to be increased while allowing an emitter resistance to be reduced.

5 Claims, 5 Drawing Sheets

BICMOS DEVICE HAVING A CMOS GATE ELECTRODE AND A BIPOLAR EMITTER EACH CONTAINING TWO IMPURITIES OF THE SAME CONDUCTIVITY TYPE

BACKGROUND OF THE INVENTION

The present invention relates to a semiconductor device having a CMOS (Complementary Metal Oxide Semiconductor) transistor and a bipolar transistor formed on a single substrate and, more particularly, to a composite LSI (Large Scale Integrated Circuit) having the gate electrode of a MOS transistor and the emitter electrode of a bipolar transistor formed by sharing the same layers, and a method of producing the same.

Today, BiCMOS technologies are available for forming a bipolar transistor having a high current drive capability and a CMOS transistor feasible for high integration on a single chip. A BiCMOS structure is attracting increasing attention as an implementation for a small power, high speed LSI including both of digital and analog circuitry. However, a conventional BiCMOS procedure is undesirable from the cost standpoint beause it involves a great number of steps. Although various approaches to save the production steps have been proposed in the past, they have some problems left unsolved.

SUMMARY OF THE INVENTION

It is therefore an object of the present invention to provide a semiconductor device having a desirable characteristic, and a method of producing the same.

In accordance with the present invention, in a semiconductor device having a CMOS transistor and a bipolar transistor formed on a single semiconductor substrate, a gate electrode and an emitter electrode included in the CMOS transistor and bipolar transistor, respectively, are formed by sharing the same polysilicon layers. An impurity contained in an nMOS gate electrode and an emitter electrode of the bipolar transistor has a lower concentration than an emitter diffusion layer formed in the intrinsic base region of the bipolar transistor.

Also, in accordance with the present invention, a method of producing a semiconductor device has the steps of forming an emitter contact hole, introducing an impurity via the emitter contact hole by ion implantation to thereby form an emitter diffusion region, forming a gate electrode and an emitter electrode of a MOS transistor, effecting formation of an nMOS source-drain and introduction of an impurity into an emitter electrode of a bipolar transistor at the same time, effecting first annealing, effecting formation of a pMOS source-drain and introduction of an impurity into an extrinsic base region of the bipolar transistor at the same time, and effecting second annealing.

BRIEF DESCRIPTION OF THE DRAWINGS

The above and other objects, features and advantages of the present invention will become apparent from the following detailed description taken with the accompanying drawings in which.

DESCRIPTION OF THE PREFERRED EMBODIMENTS

To better understand the present invention, brief reference will be made to a conventional method of producing a semiconductor device, shown in FIGS. 1A–1D. The semiconductor device has a BiCMOS structure customarily used to reduce the number of production steps.

Figure 1A:
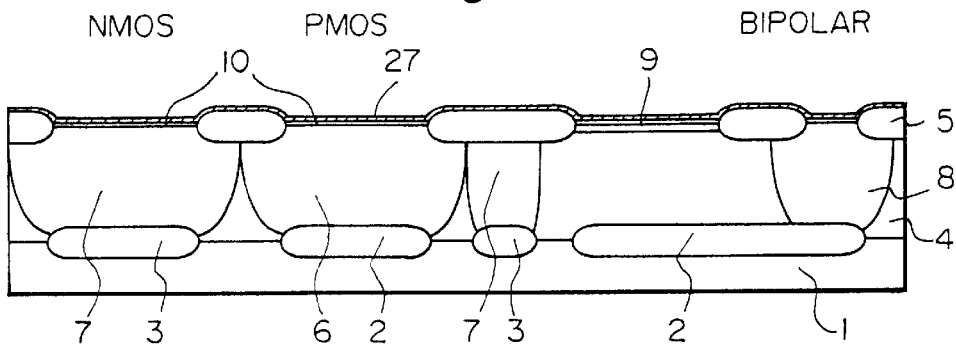
FIGS. 1A–1D are sections showing a conventional method of producing a semiconductor device.

First, as shown in FIG. 1A, an n-type epitaxial layer 4 is formed on a semiconductor substrate 1 having an n-type and a p-type buried layer 2 and 3 thereinside. A field oxide layer 5 is formed on the epitaxial layer 4 by conventional LOCOS (Local Oxidation of Silicon). Subsequently, there are formed an n-type well region 6 and a p-type well region 7 as well as an n-type collector lead-out region 8 and an intrinsic base region 9 of a bipolar transistor. Just after a gate oxide film, 10 of a MOS transistor has been formed to a thickness of 5 nm to 20 nm, a polysilicon layer 27 is formed on the gate oxide film 10 to a thickness of 50 nm to 100 nm. When an emitter contact hole is formed, as will be described, the polysilicon layer 27 is used to protect the gate oxide film 10 from defective breakdown voltage ascribable to contamination and damage.

Figure 1B:
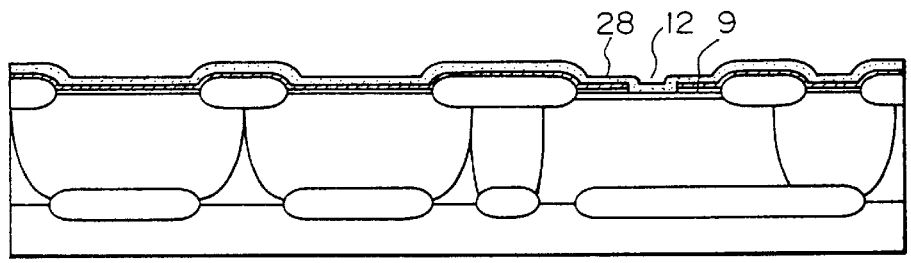

As shown in FIG. 1B, the polysilicon layer 27 and gate oxide film 10 are etched in order to form an emitter contact hole 12. Then, a polysilicon layer 28 is formed over the entire surface of the substrate 1 to a thickness of 100 nm to 200 nm.

Figure 1C:
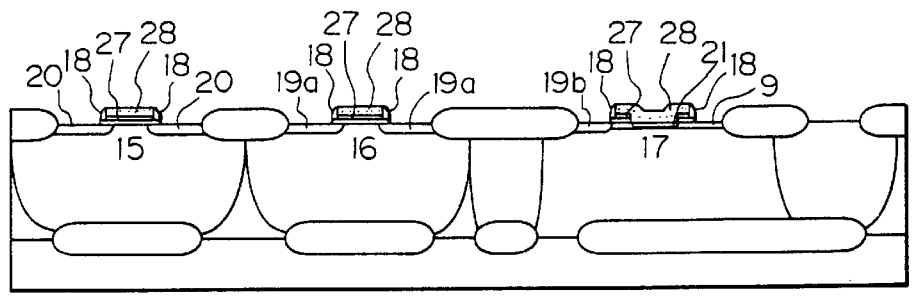

As shown in FIG. 1C, the polysilicon layers 28 and 27 are etched in order to form a gate electrode 15 of an nMOS transistor, a gate electrode 16 of a pMOS transistor, and an emitter electrode 17 of the bipolar transistor. After a 100 nm to 150 nm thick oxide film has been formed, side walls 18 are respectively formed around the gate electrodes 15 and 16 and emitter electrode 17 by anisotropic dry etching. Subsequently, boron ions are implanted in a source-drain region 19a of the pMOS transistor, the gate electrode 16 and an outside base region 19b of the bipolar transistor by acceleration energy of 10 keV and in a dose of $5 \times 10^{15}$ cm$^{-2}$ to $7 \times 10^{15}$ cm$^{-2}$. On the other hand, arsenic ions are implanted in a source-drain region 20 of the nMOS transistor, the gate electrode 15, and the emitter electrode 17 of the bipolar transistor by acceleration energy of 30 keV and in a dose of $1 \times 10^{16}$ cm$^{-2}$ to $2 \times 10^{16}$ cm$^{-2}$. The resulting laminate is annealed at 850° C. to 900° C. in a nitrogen atmosphere in order to activate the implanted impurities. Specifically, in the gate electrode 16 of the pMOS transistor, boron is diffused from the upper polysilicon layer 28 to the lower polysilicon layer 27, forming a p-type gate electrode. Likewise, in the gate electrode of the nMOS transistor, arsenic is diffused from the upper polysilicon layer 28 to the lower polysilicon layer 27, forming an n-type gate electrode. Further, in the emitter electrode 17 of the bipolar transistor, arsenic is diffused from the upper polysilicon layer 28 to the lower polysilicon layer 27 and intrinsic base region 9, forming an emitter diffusion region 21.

Figure 1D:
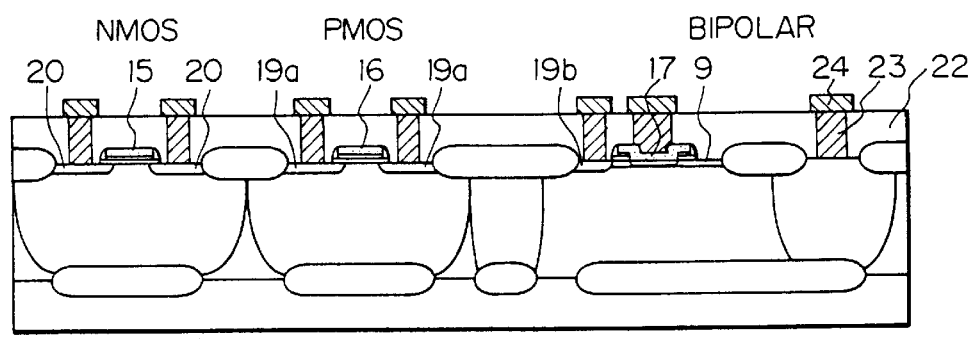

Thereafter, as shown in FIG. 1D, an interlayer dielectric film 22 is formed on the entire surface of the substrate produced by the above procedure. Then, contacts are opened in the dielectric film 22, and plugs 23 are formed by use of, e.g., tungsten. Finally, metal wirings 24 are formed, completing a semiconductor device.

As stated above, to save the production steps, the gate electrodes 15 and 16 of the MOS transistors and the emitter electrode 17 of the bipolar transistor are formed by sharing the polysilicon layers 27 and 28. Further, to simplify the production, the source-drain region 19a of the pMOS transistor and the outside base region 19b of the bipolar transistor are formed by a single step. In addition, the formation of the source-drain region 20 of the nMOS transistor and the implantation of the impurity in the emitter electrode 17 of the bipolar transistor are effected by a single step.

The part of the above specific BiCMOS structure relating only to the bipolar transistor is disclosed in, e.g., Japanese Patent Publication No. 7-44184 specifically.

However, the conventional semiconductor device and procedure for producing it have the following disadvantages. The p-type electrode portion of the pMOS transistor is implemented by the implantation and diffusion of boron in the upper polysilicon layer 28, as stated above. In the p-type electrode portion, boron diffused to the lower silicon layer 27 is further diffused to the silicon substrate 1 via the gate oxide film 10, resulting in the variation of the threshold voltage of the pMOS transistor. Moreover, such penetration of boron is accelerated by the annealing atmosphere and temperature and fluorine present in polysilicon. This aggravates limitation on the production conditions after the introduction of boron into the gate electrode.

Figure 2:
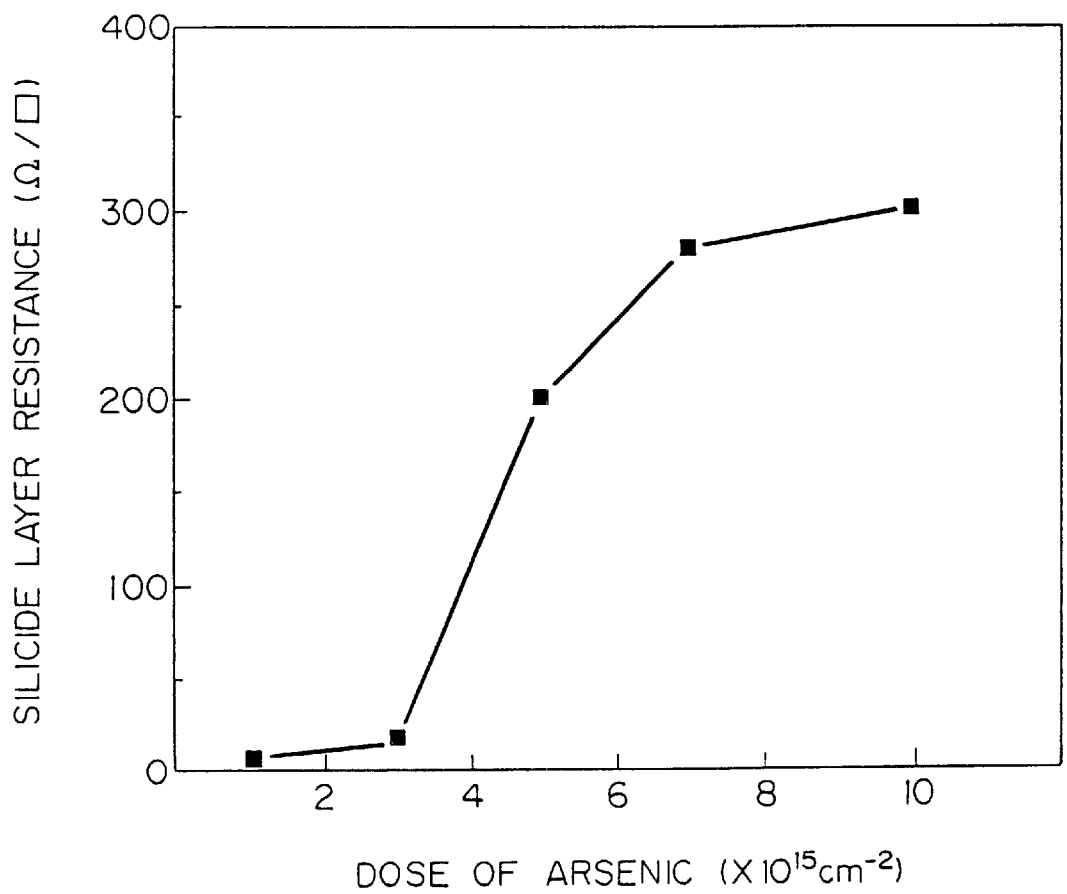
FIG. 2 is a graph showing a relation between the dose of arsenic and the resistance of a silicide layer.

On the other hand, a silicide layer formed by the silicidation of the nMOS gate electrode 15 has a resistance noticeably susceptible to the dose of arsenic implanted in the polysilicon layer, as shown in FIG. 2. The inventor has determined that so long as the dose of arsenic is as small as $1 \times 10^{15}$ cm$^{-2}$ to $3 \times 10^{15}$ cm$^{-2}$, a desirable silicide layer with low resistance is achievable. However, when the dose increases to $1 \times 10^{16}$ cm$^{-2}$ to $2 \times 10^{16}$ cm$^{-2}$, silicidation is obstructed with the result that the silicide film has its thickness reduced and therefore has its resistance increased to a noticeable degree. It is therefore optimal to implant about $1 \times 10^{15}$ cm$^{-2}$ to $3 \times 10^{15}$ cm$^{-2}$ of arsenic in the gate electrode and source-drain region of the nMOS portion in order to reduce the resistance of the silicide layer.

Assume that the impurity introduced into the polysilicon layer of the emitter portion included in the bipolar transistor has a concentration of, e.g., about $1 \times 10^{15}$ cm$^{-2}$ to $3 \times 10^{15}$ cm$^{-2}$ as low as in the nMOS gate electrode 15. Such a small amount of emitter impurity causes the impurity to decrease around the emitter contact (generally referred to as a plugging effect). This brings about a decrease into current amplification factor and an increase in emitter resistance as well as other defects. In this manner, the optimal dose of impurity for the nMOS transistor and the optimal dose of impurity for the bipolar transistor are different from each other.

In light of the above, the impurity may be implanted in each of the gate electrode and source-drain region of the nMOS transistor and the emitter electrode of the bipolar transistor independently, each in an optimal dose. This, however, increases the number of production steps.

DETAILED DESCRIPTION OF THE INVENTION

Figure 3A:
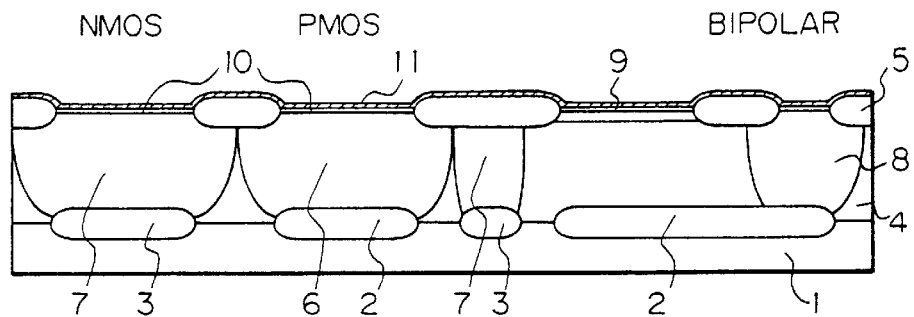
FIGS. 3A–3D are sections showing a procedure for producing a semiconductor device embodying the present invention.

Referring to FIGS. 3A–3D, a procedure for producing a semiconductor device embodying the present invention will be described. As shown in FIG. 3A, an n-type epitaxial layer 4 is formed on a semiconductor substrate 1 having an n-type and a p-type buried layer 2 and 3 therein. A field oxide layer 5 is formed on the substrate 1 by LOCOS. Subsequently, an n-type well region 6 and a p-type well region 7 and an n-type collector lead-out region 8 and an in intrinsic base region 9 of a bipolar transistor are formed. Then, just after a gate oxide film 10 of a MOS transistor has been formed to a thickness of 5 nm to 20 nm, a polysilicon layer 11 is formed to a thickness of 50 nm to 100 nm.

Figure 3B:
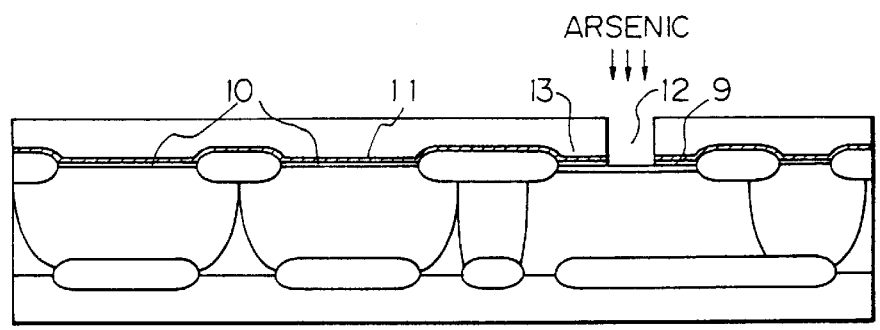

As shown in FIG. 3B, photoresist 13 is formed on the polysilicon layer 11 and then patterned. Subsequently, the polysilicon layer 11 is etched in the emitter region of the bipolar transistor with the patterned photoresist 13 playing the role of a mask, thereby forming an emitter contact hole 12. Then, an n-type impurity is introduced into the intrinsic base region 9 via the emitter contact hole 12 by ion implantation. Assuming that the n-type impurity is implemented by arsenic, then the acceleration energy and dose are respectively selected to be 30 keV and $5 \times 10^{14}$ cm$^{-2}$ to $1 \times 10^{16}$ cm$^{-2}$. Arsenic may, of course, be replaced with antimony or phosphor.

Figure 3C:
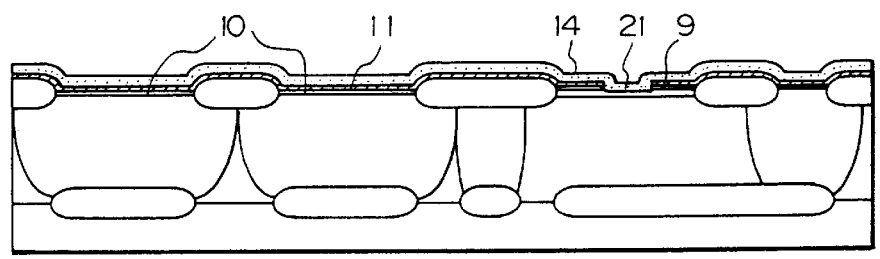

After the gate oxide film 10 is etched and stripped as shown in FIG. 3C, a 100 nm to 200 nm thick polysilicon layer 14 is formed over the entire surface of the substrate 1.

Assume that the n-type impurity introduced into the intrinsic base region 9 has a surface concentration above, e.g., about $1 \times 10^{20}$ cm$^{-3}$. Then, when the substrate 1 is conveyed into a CVD (Chemical Vapor Deposition) apparatus in order t 0 grow the polysilicon layer 14, it is likely that oxygen (air) around the inlet of the CVD apparatus enters the apparatus and forms an oxide film on the exposed n-type impurity layer. This oxide film makes it difficult to set up desirable contact between the polysilicon layer 14 and the n-type diffusion layer. This problem will be solved if use is made of a so-called load-lock type polysilicon growth apparatus in which a substrate is introduced into a vacuum chamber and then into a growth chamber. Alternatively, the extremely thin oxide film may be removed by reduction using hydrogen gas before the growth of the polysilicon layer 14 to be effected in a growth chamber.

Figure 3D:
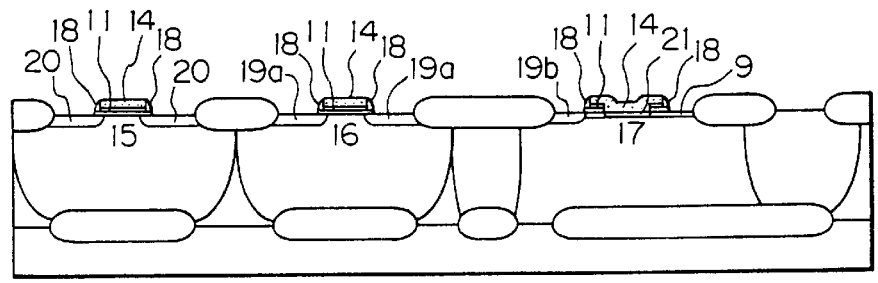

As shown in FIG. 3D, the polysilicon layers 14 and 11 are etched in order to form a gate electrode 15 of an nMOS transistor, a gate electrode 16 of a pMOS transistor, and an emitter electrode 17 of the bipolar transistor. Subsequently, a 100 nm to 150 nm thick oxide film is formed and then subjected to dry etching so as to form side walls 18 around the gate electrodes 15 and 16 and emitter electrode 17. Thereafter, arsenic ions are implanted in a source-drain region 20 and gate electrode 15 of the nMOS region and the emitter electrode 17 of the bipolar transistor by acceleration energy of 30 keV and in a dose of $3 \times 10^{15}$ cm$^{-2}$. The resulting substrate is annealed in a nitrogen atmosphere at 900° C. in order to activate the implanted impurity. Specifically, in the gate electrode 15 of the nMOS transistor, arsenic is diffused from the upper polysilicon layer 14 to the lower polysilicon layer 11, forming an n-type gate electrode. Likewise, in the emitter electrode 17 of the bipolar transistor, arsenic i s diffused from the upper polysilicon layer 14 to the lower polysilicon layer 11, forming the emitter electrode 17.

Further, boron ions are implanted in the source-drain region 19a and gate electrode 16 of the pMOS transistor and an outside base region 19b of the bipolar transistor by acceleration energy of 10 keV and in a dose of $5 \times 10^{15}$ cm$^{-2}$ to $7 \times 10^{15}$ cm$^{-2}$. This impurity is activated in a nitrogen atmosphere at 800° C. Specifically, in the gate electrode 16, boron is diffused from the upper polysilicon layer 14 to the lower polysilicon layer 11, forming a p-type gate electrode. After an interlayer dielectric film 22 has been formed on the substrate produced by the above produce, contacts are formed in the dielectric film 22, and then plugs 23 are formed by use of tungsten. Finally, metal wirings 24 are formed to complete a semiconductor device shown in FIG. 4.

In the illustrative embodiment, the gate electrode and emitter electrode are formed by sharing the same polysilicon layers, and the formation of the source-drain of the nMOS transistor and the impurity implantation in the emitter electrode of the bipolar transistor are effected by a single step. This, however, does not bring about the previously mentioned troubles including a decrease in current amplification factor and an increase in emitter resistance, because an emitter diffusion layer is formed beforehand to implement an optimal low n-type impurity concentration for the silicidation of the nMOS gate electrode. Further, in the illustrative embodiment, the source-drain of the pMOS transistor and the extrinsic base region of the bipolar transistor are formed by a single step. Nevertheless, because annealing necessary for the nMOS transistor and the emitters of the bipolar transistor is effected before the above step, annealing following the boron implantation can be effected at a temperature low enough to obviate the penetration of boron, e.g., 800° C. or below.

Reference will be made to FIGS. 5A–5D for describing an alternative embodiment of the present invention. This embodiment is essentially similar to the previous embodiment except for the following. After the polysilicon layer 11 and gate oxide film 10 have been etched in the emitter region of the bipolar transistor in order to form the emitter contact film 12, the n-type impurity is introduced into the intrinsic base region 9 by ion implantation. At this instant, this embodiment removes the photoresist mask used to form the contact hole 12, and then implants the n-type impurity over the entire surface of the substrate 1. As a result, the n-type impurity introduced into the lower polysilicon layer 11 captures the boron atoms. This embodiment is therefore capable of obstructing the penetration of boron more than the previous embodiment. Another advantage achievable with this embodiment is that in the nMOS transistor the above n-type impurity is added to the n-type impurity introduced into the gate electrode at the time of formation of the source-drain, obstructing depletion in the nMOS gate electrode. The n-type impurity to be introduced into the lower polysilicon layer 11 may be implemented by arsenic, phosphor, antimony or similar substance. Among them, phosphor is optimal because it obstructs the penetration of boron due to little segregation to the grain boundary portions of polysilicon even with a low concentration.

Figure 5A:
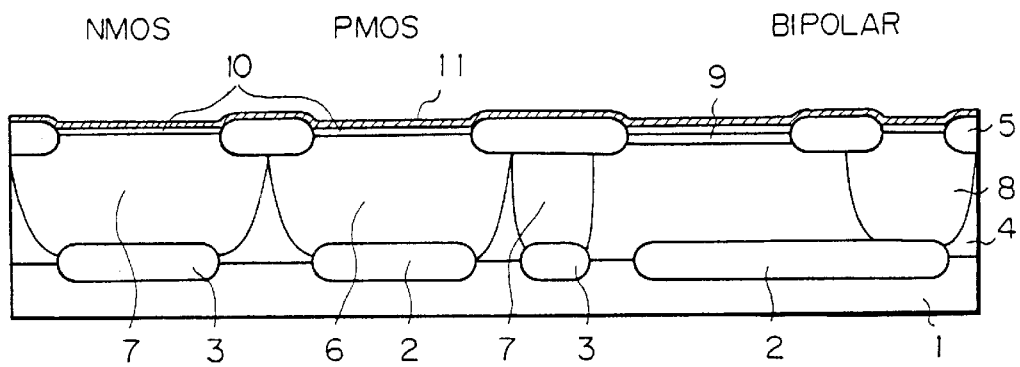
FIGS. 5A–5D are sections showing an alternative embodiment of the present invention.
Figure 5B:
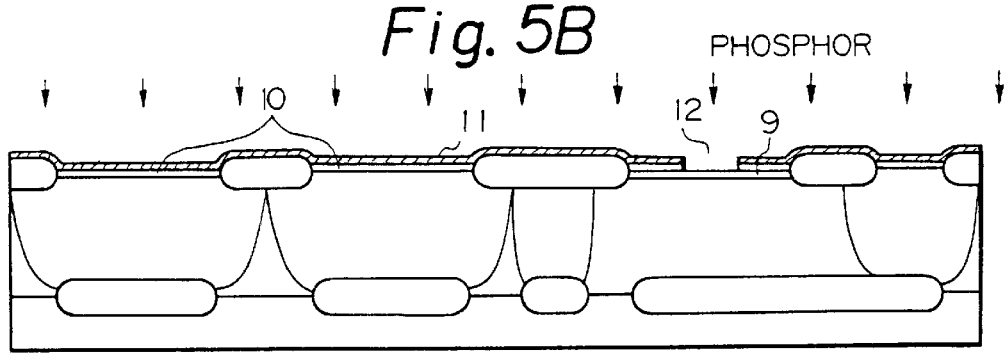

Specifically, the step shown in FIG. 5A is identical with the step described with reference to FIG. 3A. In the illustrative embodiment, as shown in FIG. 5B, the polysilicon layer 11 and gate oxide film 10 are etched in the emitter region of the bipolar transistor in order to form the emitter contact hole 12. Subsequently, the photoresist mask used to form the hole 12 is removed, and then an n-type impurity is implanted in the intrinsic base region 9 over the entire surface of the substrate 1. For ion implantation, use may be made of acceleration energy of 5 keV and a dose of $1\times10^{15}$ $cm^{-2}$ to $1\times10^{16}$ $cm^{-2}$ by way of example. If desired, the n-type impurity may be implemented by antimony or arsenic.

Figure 5C:
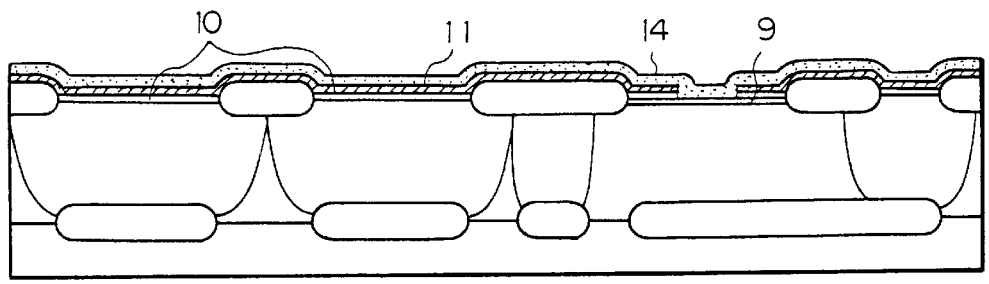
Figure 5D:
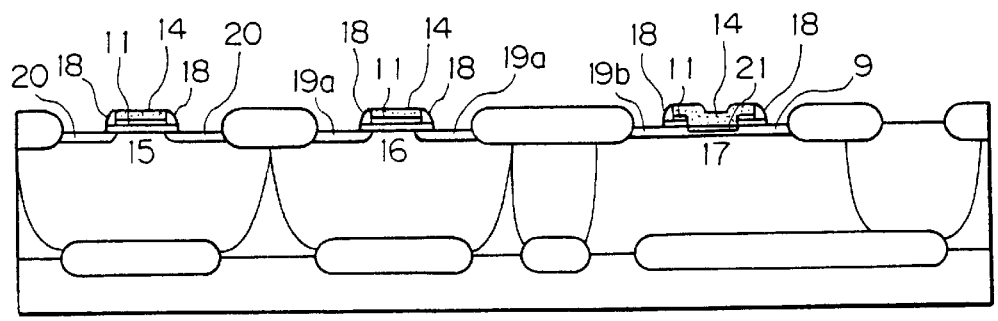

The steps shown in FIGS. 5C and 5D are respectively identical with the steps described with reference to FIGS. 3C and 3D and will not be described in order to avoid redundancy.

Figure 4:
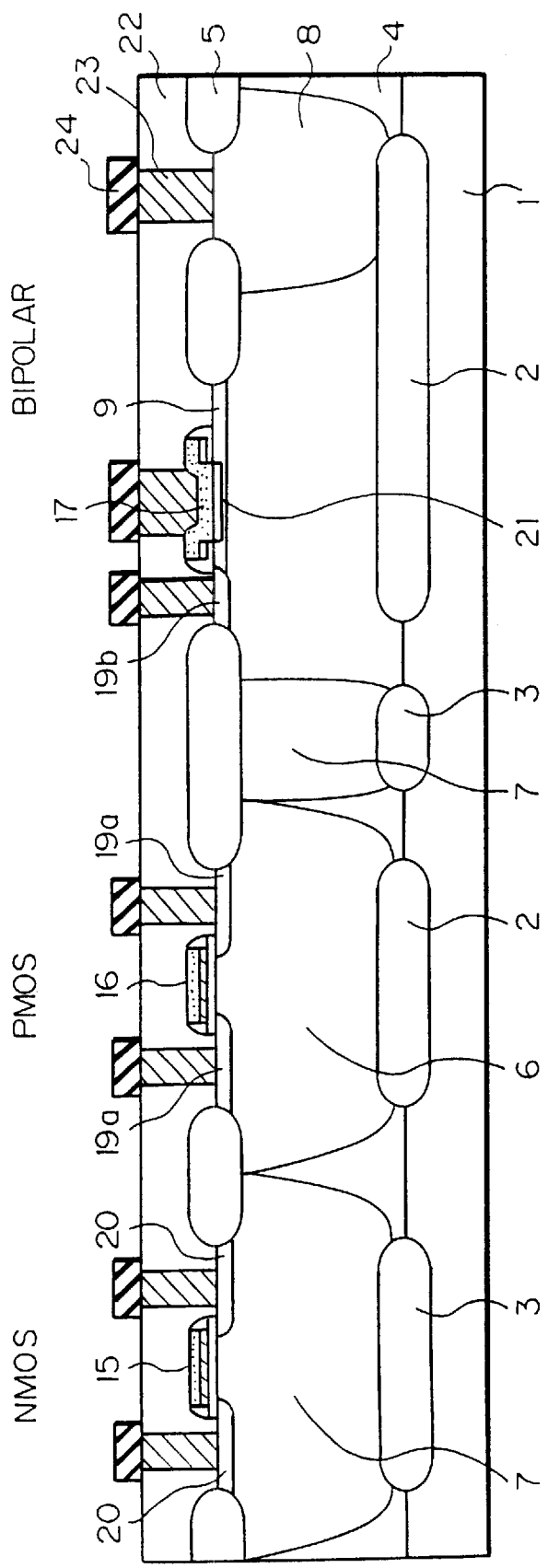
FIG. 4 is a section showing the semiconductor device produced by the procedure of FIGS. 3A–3D.

The resulting semiconductor device also has the configuration shown in FIG. 4.

In any one of the above embodiments, the emitter diffusion layer 21 provided in the substrate 1 may be constituted by two or more different kinds of impurities. For example, assume that the n-type impurity to be introduced by ion implantation is antimony while the n-type impurity to be introduced into the polysilicon layer of the emitter electrode 17 is phosphor. Then, the resulting substrate may be annealed at 900° C. to 800° C. in order to diffuse phosphor from polysilicon into the substrate 1 and further diffuse it to cover the antimony junction. This can be done because antimony in silicon has a diffusion constant smaller than the diffusion constant of phosphor by about two figures. If the antimony junction having such a small impurity diffusion constant and a sharp impurity distribution is covered with phosphor having a relatively great impurity diffusion constant and a relatively gentle impurity distribution, then it is possible to ease an electric field between the base and the emitter. With this kind of configuration, a base-emitter breakdown voltage 2 V to 3 V higher than one available with only antimony is achievable.

In summary, in accordance with the present invention, after boron or similar p-type impurity has been introduced into a polysilicon layer constituting a pMOS gate, annealing can be effected at an optimal temperature low enough to prevent the impurity from entering a silicon substrate via a gate oxide film, e.g., 800° C. or below in the case of boron. This prevents the characteristic of a transistor, e.g., threshold voltage from being varied. Further, in an nMOS gate electrode and source-drain region, the n-type impurity can be provided with a concentration reducing the resistance of a silicide layer. In addition, in the emitter diffusion layer of a bipolar transistor, the concentration of the n-type impurity does not fall and allows a current amplification factor to be increased while allowing an emitter resistance to be reduced.

Various modifications will become possible for those skilled in the art after receiving the teachings of the present disclosure without departing from the scope thereof.

What is claimed is:

1. A semiconductor device comprising a pMOS transistor, an nMOS transistor, and a bipolar transistor formed on a single semiconductor substrate, wherein gate electrodes of the nMOS and pMOS transistors and an emitter electrode of the bipolar transistor are constituted of the same polysilicon layers, wherein the nMOS gate electrode and an emitter diffusion layer of the bipolar transistor contain two different impurities of the same conductivity type, wherein upper surfaces of the nMOS gate electrode and the emitter electrode contain a dose of As in the range of $1\times10^{\cdot-2}$ $cm^{-2}$ to $3\times10^{15}$ $cm^{-2}$, wherein the gate electrode of the pMOS transistor contains two impurities of different conductivity types, and wherein the gate electrodes of the pMOS and nMOS transistors contain a common impurity P.

2. A semiconductor device as claimed in claim 1, wherein two different impurities of the same conductivity type in the emitter diffusion layer comprise a first implanted impurity and a second impurity.

3. A semiconductor device comprising a CMOS transistor and a bipolar transistor formed on a single semiconductor substrate and having a gate electrode and an emitter electrode, respectively, constituted of the same polysilicon layer, wherein upper surfaces of an nMOS gate electrode and the emitter electrode contain a dose of arsenic in the range of $1\times10^{15}$ $cm^{-2}$ to $3\times10^{15}$ $cm^{-2}$, and wherein a pMOS gate electrode contains two kinds of impurities of different conductivity types.

4. A semiconductor device as claimed in claim 3, wherein the nMOS gate electrode and an emitter diffusion layer of the bipolar transistor contain an n-type impurity other than arsenic.

5. A semiconductor device as claimed in claim 4, wherein the n-type impurity in the nMOS gate electrode and the emitter diffusion layer that is other than arsenic is an implanted impurity.

* * * * *